US010261272B2

(12) United States Patent
Morioka et al.

(10) Patent No.: US 10,261,272 B2
(45) **Date of Patent: *Apr. 16, 2019**

(54) OPTICAL RECEPTACLE AND OPTICAL MODULE

(71) Applicant: Enplas Corporation, Saitama (JP)

(72) Inventors: Shimpei Morioka, Saitama (JP); Naofumi Mirumachi, Saitama (JP); Yasuhiro Suzuki, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/546,316

(22) PCT Filed: Jan. 21, 2016

(86) PCT No.: PCT/JP2016/051675

§ 371 (c)(1),
(2) Date: Jul. 26, 2017

(87) PCT Pub. No.: WO2016/121613

PCT Pub. Date: Aug. 4, 2016

(65) Prior Publication Data

US 2017/0371111 A1 Dec. 28, 2017

(30) Foreign Application Priority Data

Jan. 28, 2015 (JP) ................................ 2015-014299

(51) Int. Cl.
*G02B 6/26* (2006.01)
*G02B 6/42* (2006.01)
(Continued)

(52) U.S. Cl.
CPC ......... *G02B 6/4214* (2013.01); *G02B 6/4286* (2013.01); *H01S 5/0071* (2013.01);
(Continued)

(58) Field of Classification Search
CPC ........ G02B 6/26; G02B 6/4214; G02B 6/262; G02B 6/32
See application file for complete search history.

(56) References Cited

U.S. PATENT DOCUMENTS 8,933,391 B2 1/2015 Yan et al.
9,057,852 B2 6/2015 Morioka et al.
(Continued)

FOREIGN PATENT DOCUMENTS

CN 103543503 A 1/2014
JP 2006-344915 A 12/2006
JP 2013-137507 A 7/2013

OTHER PUBLICATIONS

International Search Report from International Application No. PCT/JP20161051675 dated Apr. 26, 2016.

*Primary Examiner* — Jennifer Doan
(74) *Attorney, Agent, or Firm* — Brundidge & Stanger, P.C.

(57) ABSTRACT

This optical receptacle has: a first optical surface on which light emitted from a photoelectric conversion element is incident; a second optical surface for emitting the light incident on the first optical surface to an end surface of an optical transmission body; a light separating part for separating the light incident on the first optical surface into signal light oriented toward the end surface of the optical transmission body and monitor light oriented toward a detection element so as to proceed in a direction substantially opposite to the progress direction of the signal light; and a third optical surface for emitting the monitor light separated by the light separating part toward the detection element. The entire optical path between the first optical surface and the second optical surface is positioned inside the optical receptacle.

4 Claims, 13 Drawing Sheets

(51) Int. Cl.
*H01S 5/00* (2006.01)
*H01S 5/022* (2006.01)
*H01S 5/42* (2006.01)

(52) U.S. Cl.
CPC ........ *H01S 5/02292* (2013.01); *G02B 6/4249* (2013.01); *G02B 6/4292* (2013.01); *H01S 5/02284* (2013.01); *H01S 5/42* (2013.01)

(56) References Cited

U.S. PATENT DOCUMENTS

| | | | |
|---|---|---|---|
| 2012/0193522 A1 | 8/2012 | Yan et al. | |
| 2012/0261559 A1 | 10/2012 | Yan et al. | |
| 2014/0328558 A1 | 11/2014 | Morioka et al. | |
| 2017/0219782 A1* | 8/2017 | Nishimura ........... | G02B 6/3898 |

* cited by examiner

OPTICAL RECEPTACLE AND OPTICAL MODULE

TECHNICAL FIELD

The present invention relates to an optical receptacle and to an optical module having the same.

BACKGROUND ART

Conventionally, in optical communications using an optical transmission member such as optical fibers or optical waveguides, an optical module having a light emitting element such as a surface-emitting laser (for example, a VCSEL: Vertical Cavity Surface Emitting Laser) is used. The optical module has an optical receptacle that causes light including communication information emitted from a light emitting element to be incident on an end surface of an optical transmission member.

Some optical modules have a detecting element for monitoring the intensity and amount of light emitted from the light emitting element for the purpose of stabilizing output characteristics of the light emitting element against temperature changes and of adjusting the light output.

For example, in PTL 1 an optical module is disclosed which has a photoelectric conversion device in which a light emitting element and a detecting element are disposed, and an optical receptacle that optically connects the light emitting element and an end surface of an optical transmission member.

FIG. 1 is a cross-sectional view that schematically illustrates the configuration of optical module 10 disclosed in PTL 1. As illustrated in FIG. 1, optical module 10 disclosed in PTL 1 includes photoelectric conversion device 20 and optical receptacle 30 made of resin. Optical receptacle 30 includes: first optical surface 31 that allows light emitted from light emitting element 21 to be incident thereon; second optical surface 32 that emits light that passes through the inside thereof so that the light concentrates at end surface 23 of optical transmission member 22; reflecting surface 33 that reflects the light incident on first optical surface 31 to the side of optical transmission member 22; light separating section 34 that separates the light reflected by reflecting surface 33 into monitoring light Lm directed toward the side of detecting element 24, and signal light Ls directed toward the side of optical transmission member 22; and third optical surface 35 that emits monitoring light Lm toward detecting element 24. Light separating section 34 is formed as one part of an inner face of recess 36 that is formed in optical receptacle 30.

In optical module 10 disclosed in PTL 1, the light emitted from light emitting element 21 and incident on first optical surface 31 is reflected by reflecting surface 33 toward light separating section 34. The light reflected by reflecting surface 33 is separated into signal light Ls and monitoring light Lm by light separating section 34. Monitoring light Lm separated by light separating section 34 is emitted from third optical surface 35 toward a light receiving surface of detecting element 24. On the other hand, signal light Ls separated by light separating section 34 passes through light separating section 34 and is emitted to outside of optical receptacle 30. Signal light Ls is then incident again on optical receptacle 30 from incidence surface 37 that is another part of the inner face of recess 36. Signal light Ls incident on incidence surface 37 is emitted from second optical surface 32 toward end surface 23 of optical transmission member 22.

CITATION LIST

Patent Literature

PTL 1
Japanese Patent Application Laid-Open No. 2013-137507

SUMMARY OF INVENTION

Technical Problem

However, in optical module 10 disclosed in PTL 1, the light emitted from light emitting element 21 passes through a plurality of interfaces between optical receptacle 30 (resin) and air and arrives at optical transmission member 22. At this time, part of the light emitted from light emitting element 21 is reflected at the interfaces. Further, since light that moves forth inside optical receptacle 30 is absorbed little by little by the resin constituting optical receptacle 30, if the optical path of signal light Ls inside optical receptacle 30 is long, loss of signal light Ls becomes a problem. Hence, with respect to optical module 10 according to PTL 1, there is room to improve the use efficiency of light emitted from light emitting element 21. Further, there is also room to reduce the size of optical module 10 according to PTL 1.

It is therefore an object of the present invention to provide an optical receptacle that can improve the use efficiency of light emitted from a light emitting element while being reduced in size. A further object of the present invention is to provide an optical module having the aforementioned optical receptacle.

Solution to Problem

An optical receptacle according to one aspect of the present invention is to be disposed between one or more optical transmission members and a photoelectric conversion device, the photoelectric conversion device including one or more photoelectric conversion elements and one or more detecting elements disposed at a position further away from the optical transmission member relative to the photoelectric conversion element for monitoring light emitted from the photoelectric conversion element, the optical receptacle being used for optically coupling the photoelectric conversion element and an end surface of the optical transmission member, the optical receptacle including: one or more first optical surfaces that allow light emitted from the photoelectric conversion element to be incident thereon, or that cause light emitted from the end surface of the optical transmission member and passes through inside of the optical receptacle to be emitted toward the photoelectric conversion element; one or more second optical surfaces that cause light incident on the first optical surface to be emitted toward the end surface of the optical transmission member, or allow light emitted from the end surface of the optical transmission member to be incident thereon; a light separating section disposed on an optical path between the first optical surface and the second optical surface, the light separating section separating light incident on the first optical surface into signal light directed toward an end surface side of the optical transmission member and monitoring light directed toward the detecting element side so as to move forth in an approximately opposite direction to a traveling direction of the signal light, or the light separating section causing at least one part of light incident on the second optical surface to be emitted to the photoelectric conversion element side as reception light; and one or more third optical surfaces that cause the monitoring light separated by the light separating section to be emitted toward the detecting element; in which the entire optical path between the first optical surface and the second optical surface is located inside the optical receptacle.

An optical module according to one aspect of the present invention includes: a photoelectric conversion device having a substrate, one or more photoelectric conversion elements disposed on the substrate, and one or more detecting elements disposed on the substrate for monitoring light emitted from the photoelectric conversion element; and the optical receptacle according to the present invention; in which the detecting element is disposed at a position that is further away from the optical transmission member relative to the photoelectric conversion element on the substrate.

Advantageous Effects of Invention

According to the present invention, an optical receptacle and optical module can be provided that are a small size and are excellent with respect to the use efficiency of light emitted from a light emitting element.

DESCRIPTION OF EMBODIMENTS

Embodiments of the present invention will be described in detail with reference to the accompanying drawings.

Embodiment 1

(Configuration of Optical Module)

Figure 2:
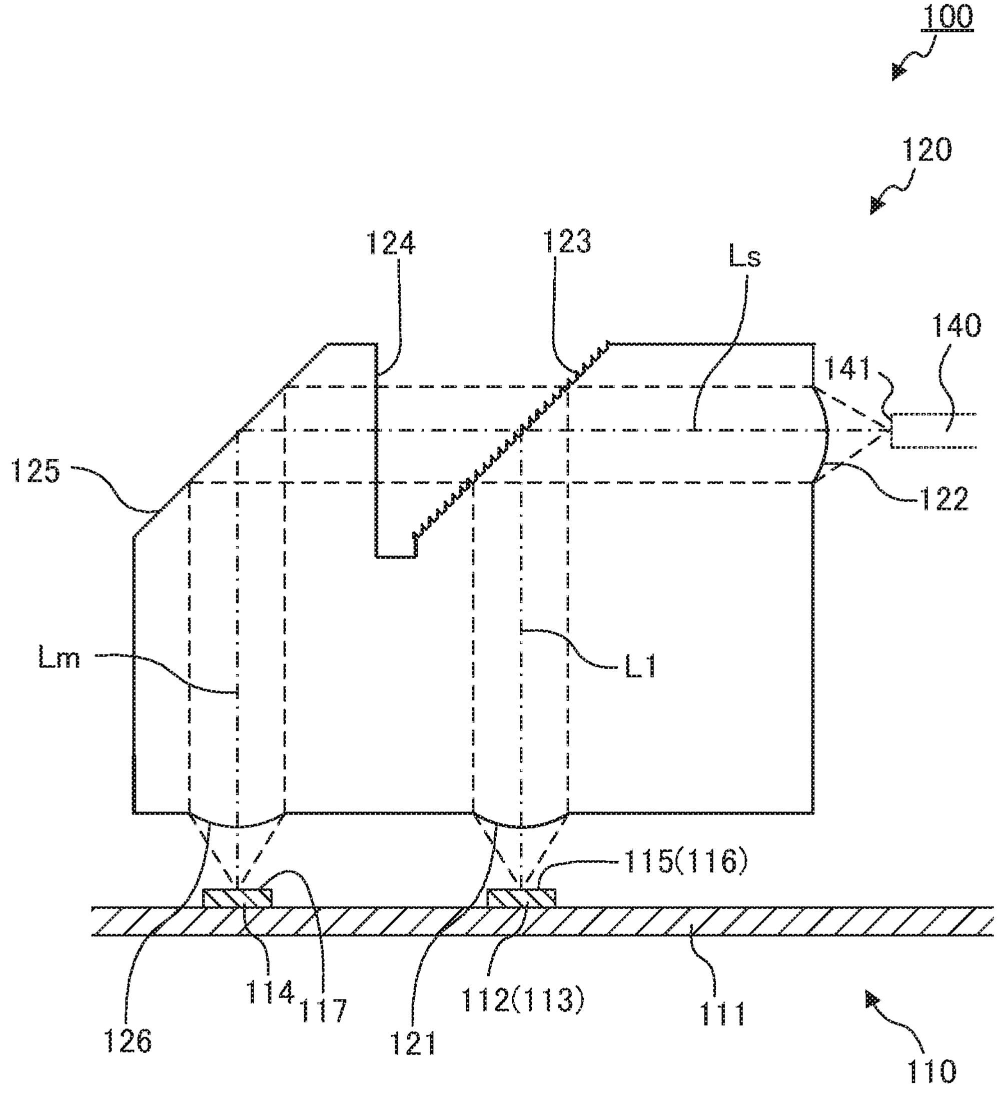
FIG. 2 is a cross-sectional view of an optical module according to Embodiment 1.
Figure 3A:
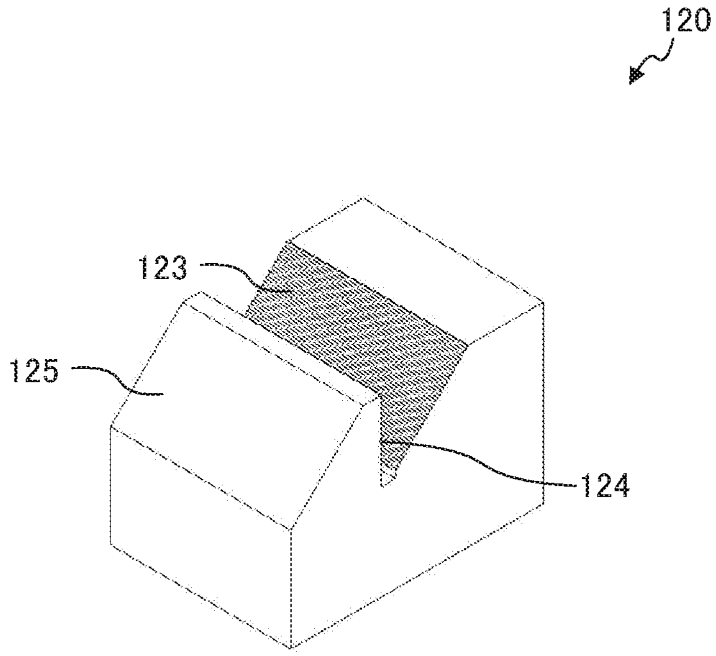
FIGS. 3A and 3B are perspective views of an optical receptacle according to Embodiment 1.
Figure 3B:
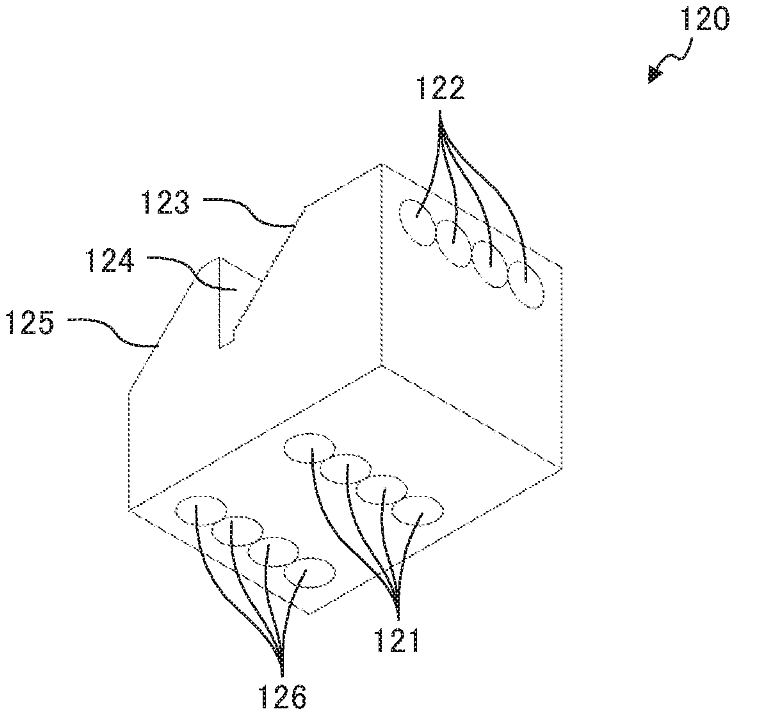

FIG. 2 is a cross-sectional view of optical module 100 according to Embodiment 1 of the present invention. In FIG. 2, hatching of a cross-section of optical receptacle 120 is omitted in order to illustrate optical paths inside optical receptacle 120. Further, an alternate long and short dash line in FIG. 2 indicates an optical axis of light, and a dashed line indicates an outer diameter of light.

As illustrated in FIG. 2, optical module 100 has substrate-mounted photoelectric conversion device 110 including a photoelectric conversion element (light emitting element 112 and/or light receiving element 113), and optical receptacle 120. Optical module 100 is used in a state in which optical transmission member 140 is connected to optical receptacle 120 through a ferrule.

The kind of optical transmission member 140 is not particularly limited, and the kinds thereof include an optical fiber and an optical waveguide. In the present embodiment, optical transmission member 140 is an optical fiber. The optical fiber may be a single-mode optical fiber or a multimode optical fiber. The number of optical transmission members 140 is not particularly limited. In the present embodiment, four optical fibers are arranged in one row at fixed intervals. Note that optical transmission members 140 may be arranged in two or more rows.

Photoelectric conversion device 110 has substrate 111, light emitting element 112 and/or light receiving element 113, and detecting element 114. In optical module 100 used for transmitting, light emitting element 112 is used as a photoelectric conversion element. In optical module 100 used for receiving, light receiving element 113 is used as a photoelectric conversion element. In addition, in optical module 100 used for transmitting and receiving, light emitting element 112 and light receiving element 113 are used as photoelectric conversion elements. In the present embodiment, optical module 100 used for transmitting and receiving is described.

Substrate 111 is, for example, a glass composite substrate, a glass epoxy substrate or a flexible substrate. Light emitting element 112, light receiving element 113 and detecting element 114 are disposed on substrate 111.

Light emitting element 112 is disposed on substrate 111 and emits laser light in a perpendicular direction with respect to a surface of substrate 111 on which light emitting element 112 is disposed. The number of light emitting elements 112 is not particularly limited. In the present embodiment the number of light emitting elements 112 is two. The positions of light emitting element 112 are also not particularly limited. In the present embodiment, the two light emitting elements 112 are arranged at regular intervals along the arrangement direction of optical transmission members 140. Light emitting element 112 is, for example, a vertical cavity surface emitting laser (VCSEL). In a case where optical transmission members 140 are arranged in two or more rows, light emitting elements 112 may also be arranged in the same number of rows.

Figure 7A:
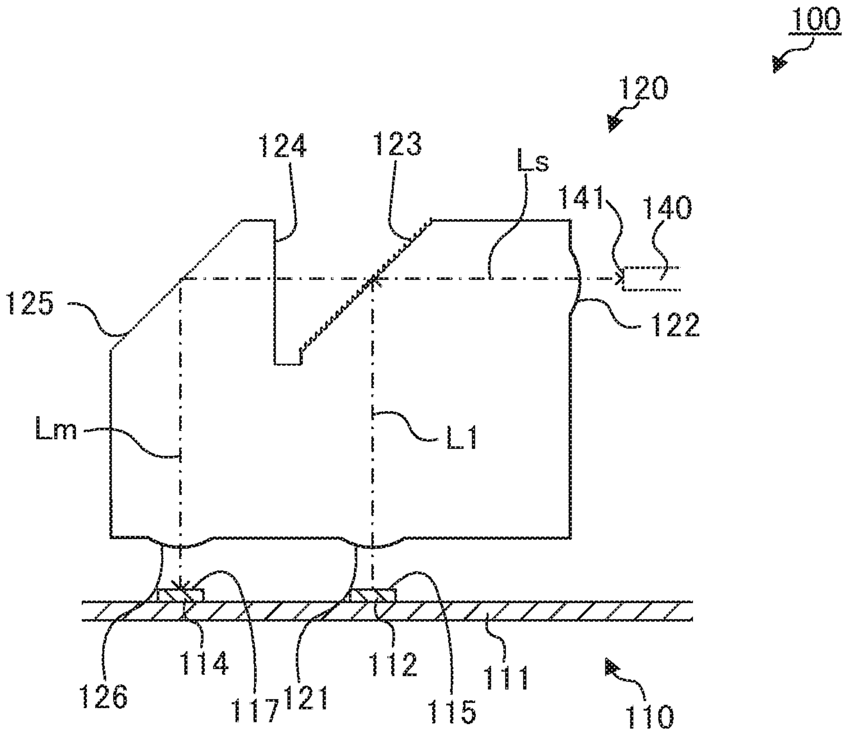
FIGS. 7A and 7B are views of an optical path in the optical module according to Embodiment 1.
Figure 7B:
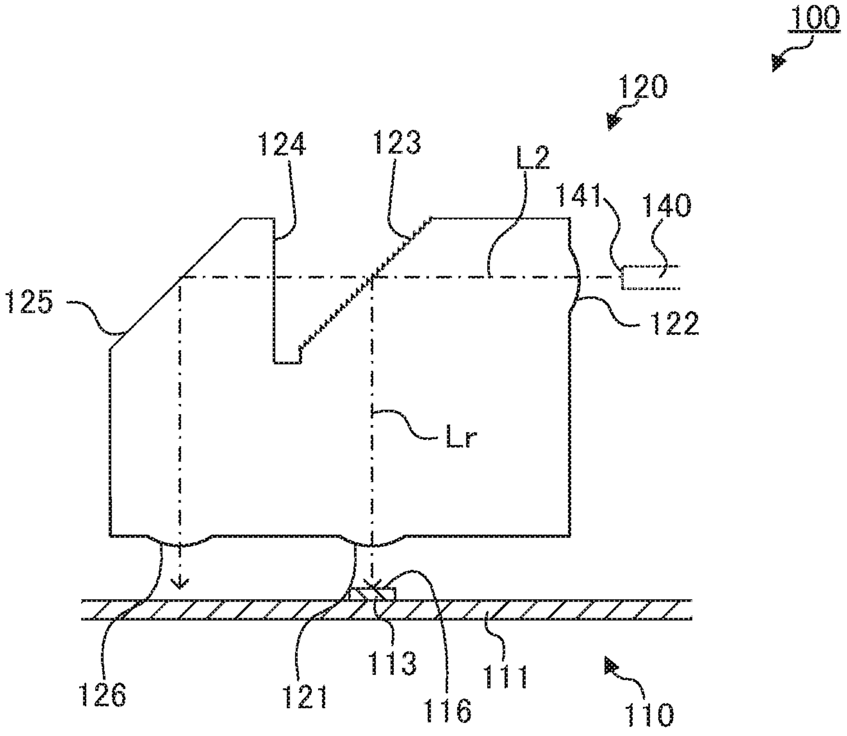

Light receiving element 113 is disposed on substrate 111, and receives reception light Lr that is at least one part of light L2 emitted from optical transmission member 140 (see FIG. 7B). The number of light receiving elements 113 is not particularly limited. In the present embodiment the number of light receiving elements 113 is two. The positions of light receiving elements 113 are also not particularly limited. In the present embodiment the two light receiving elements 113 are arranged in one row at regular intervals along the arrangement direction of optical transmission members 140. Specifically, the two light receiving elements 113 are arranged so as to be positioned on the same straight line as the two light emitting elements 112. Light receiving element 113 is, for example, a photodiode (PD). In a case where optical transmission members 140 are arranged in two or more rows, light receiving elements 113 may also be arranged in the same number of rows.

Detecting element 114 is disposed on substrate 111, and receives monitoring light Lm for monitoring an output (for example, the intensity or amount of light) of light L1 emitted from light emitting element 112. Detecting element 114 is, for example, a photodiode (PD). Detecting element 114 is disposed at a position that is further away optical transmission member 140 than light emitting element 112 and light receiving element 113. In the present embodiment, when optical module 100 is seen in a planar view, detecting element 114 is disposed on the opposite side of optical transmission member 140 from light emitting element 112 and light receiving element 113. The number of detecting elements 114 is not particularly limited. In the present embodiment the number of detecting elements 114 is two. The two detecting elements 114 are arranged in one row at regular intervals in correspondence with the two light emitting elements 112. In a case where optical transmission members 140 are arranged in two or more rows, detecting elements 114 may also be arranged in the same number of rows. Further, from the viewpoint of preventing reflected light from detecting element 114 returning into optical receptacle 120, the optical axis of light incident on detecting element 114 may be inclined relative to detection surface 117 of detecting element 114.

Optical receptacle 120 is disposed on substrate 111. In a state in which optical receptacle 120 is disposed between photoelectric conversion device 110 and optical transmission member 140, optical receptacle 120 optically couples light emitting surfaces 115 of the plurality of light emitting elements 112 and end surfaces 141 of the plurality of optical transmission members 140, respectively, and optically couples detection surfaces 117 of the plurality of detecting elements 114 and end surfaces 141 of the plurality of optical transmission members 140, respectively. Hereunder, the configuration of optical receptacle 120 is described in detail.

(Configuration of Optical Receptacle)

FIGS. 3 to 6 illustrate the configuration of optical receptacle 120 according to Embodiment 1. FIG. 3A is a perspective view of optical receptacle 120 as seen from above, and FIG. 3B is a perspective view of optical receptacle 120 as seen from below. FIG. 4A is a plan view of optical receptacle 120, FIG. 4B is a bottom surface view, FIG. 4C is a front view, and FIG. 4D is a side view. FIG. 5A is a perspective view of light separating section 123, and FIG. 5B illustrates the positional relation between faces constituting light separating section 123. FIG. 6A is a partially enlarged cross-sectional view of a portion indicated by a dashed line in FIG. 4D. FIG. 6B is a view for describing a light amount ratio between signal light Ls and monitoring light Lm.

As illustrated in FIG. 2, FIGS. 3A and 3B and FIGS. 4A to 4D, optical receptacle 120 is an approximately rectangular parallelepiped shaped member. Optical receptacle 120 has light transmitting properties, and causes light L1 emitted from light emitting surface 115 of light emitting element 112 to be emitted toward end surface 141 of optical transmission member 140, and on the other hand causes reception light Lr emitted from optical transmission member 140 to be emitted toward light receiving surface 116 of light receiving element 113. Optical receptacle 120 has a plurality of first optical surfaces 121, a plurality of second optical surfaces 122, light separating section 123, transmitting surface 124, reflecting surface 125 and a plurality of third optical surfaces 126. Optical receptacle 120 is formed using a material having light transmitting properties with respect to light of a wavelength used for optical communication. Examples of such a material include a transparent resin such as polyetherimide (PEI) and a cyclic olefin resin.

First optical surface 121 is an optical surface that causes light L1 emitted from light emitting element 112 to enter optical receptacle 120 while refracting light L1. Further, first optical surface 121 is also an optical surface that causes reception light Lr from optical transmission member 140 that has moved forth through inside of optical receptacle 120 to be emitted toward light receiving element 113 while refracting reception light Lr. In the present embodiment, the shape of first optical surface 121 is a convex lens surface which is convex toward light emitting element 112 (light receiving element 113). First optical surface 121 converts light L1 emitted from light emitting element 112 into collimated light. Further, first optical surface 121 converges collimated light (reception light Lr) that has moved forth through inside of optical receptacle 120. In the present embodiment, the plurality of (four) first optical surfaces 121 are arranged on the bottom surface of optical receptacle 120 in one row along the arrangement direction of optical transmission members 140 so as to face light emitting surfaces 115 of light emitting elements 112 and light receiving surfaces 116 of light receiving elements 113, respectively. Further, the shape in a planar view of first optical surface 121 is circular. The central axis of first optical surface 121 is preferably perpendicular to light emitting surface 115 of light emitting element 112 and light receiving surface 116 of light receiving element 113. Further, the central axis of first optical surface 121 preferably matches the optical axis of light L1 (reception light Lr incident on light receiving element 113) emitted from light emitting element 112.

Light incident on first optical surface 121 moves forth toward light separating section 123. Further, reception light Lr emitted from first optical surface 121 moves forth toward light receiving element 113. Note that, in a case where light emitting elements 112 and light receiving elements 113 are arranged in two or more rows, first optical surfaces 121 are also arranged in the same number of rows.

Figure 4A:
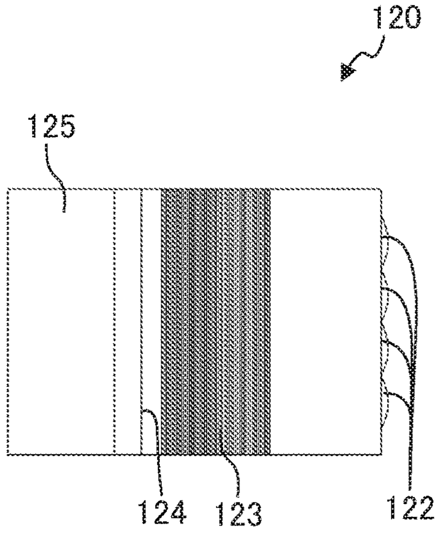
FIGS. 4A to 4D illustrate the configuration of the optical receptacle according to Embodiment 1.
Figure 4B:
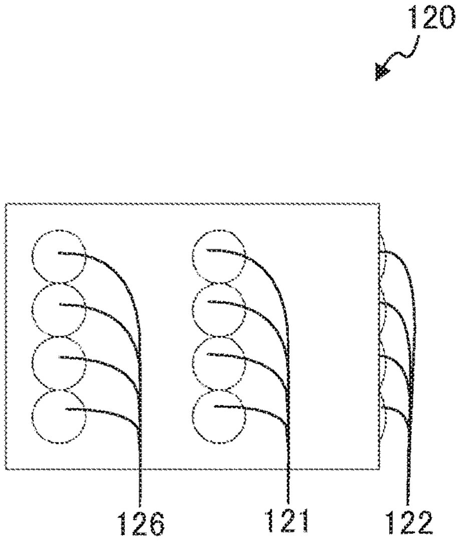

In the present embodiment, as illustrated in FIG. 4B, among the four first optical surfaces 121, two first optical surfaces 121 on the upper side in the diagrammatic representation are used as first optical surfaces 121 on a transmission side, and two first optical surfaces 121 on the lower side are used as first optical surfaces 121 on a reception side. Specifically, light L1 from light emitting elements 112 is incident on the two first optical surfaces 121 on the transmission side which are on the upper side in the diagrammatic representation, and reception light Lr that moved forth through the inside of optical receptacle 120 is emitted from the two first optical surfaces 121 on the reception side which are on the lower side in the diagrammatic representation. Thus, in the optical receptacle 120 according to the present embodiment, the four first optical surfaces 121 are equally divided into two regions by taking a plane perpendicular to substrate 111 as the center of the four first optical surfaces 121, with one of the regions functioning as the transmission side and the other region functioning as the reception side.

Light separating section 123 is disposed on an optical path between first optical surface 121 and second optical surface 122, and separates light incident on first optical surface 121 into signal light Ls directed toward end surface 141 side of optical transmission member 140, and monitoring light Lm directed toward detecting element 114 side so as to move forth in approximately the opposite direction to the traveling direction of signal light Ls. Further, light separating section

123 causes at least one part of light incident on second optical surface 122 to move forth to light receiving element 113 as reception light Lr.

Figure 5A:
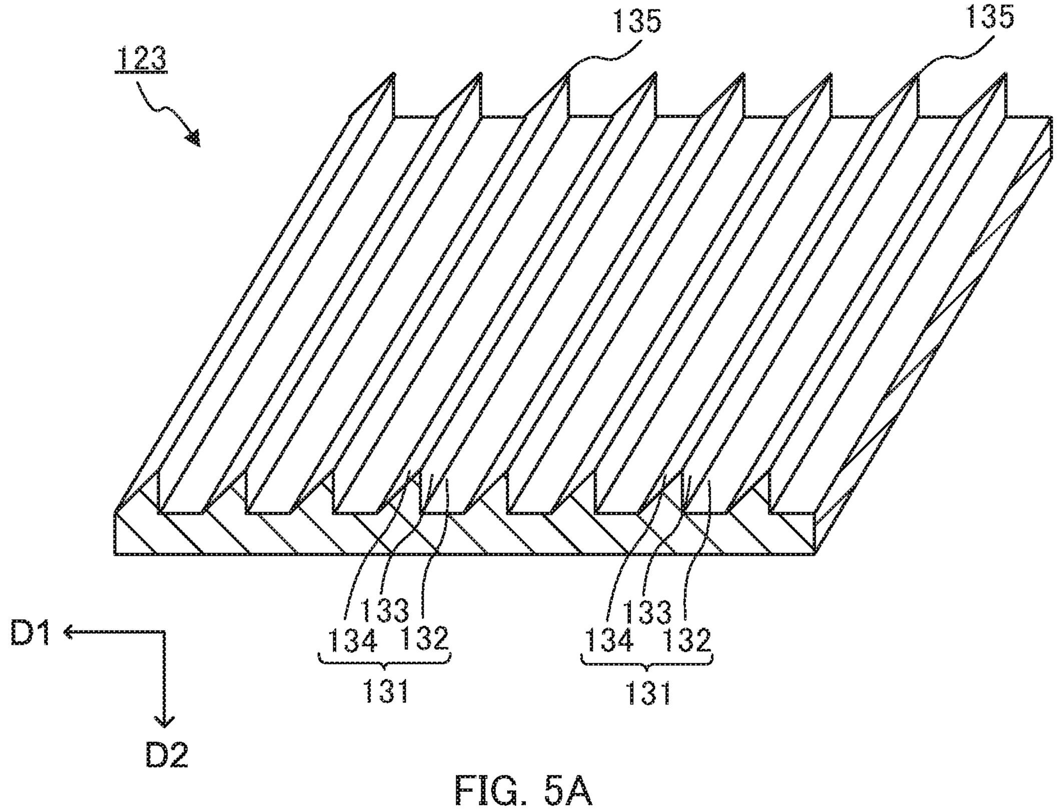
FIGS. 5A and 5B illustrate the configuration of a light separating section according to Embodiment 1.
Figure 5B:
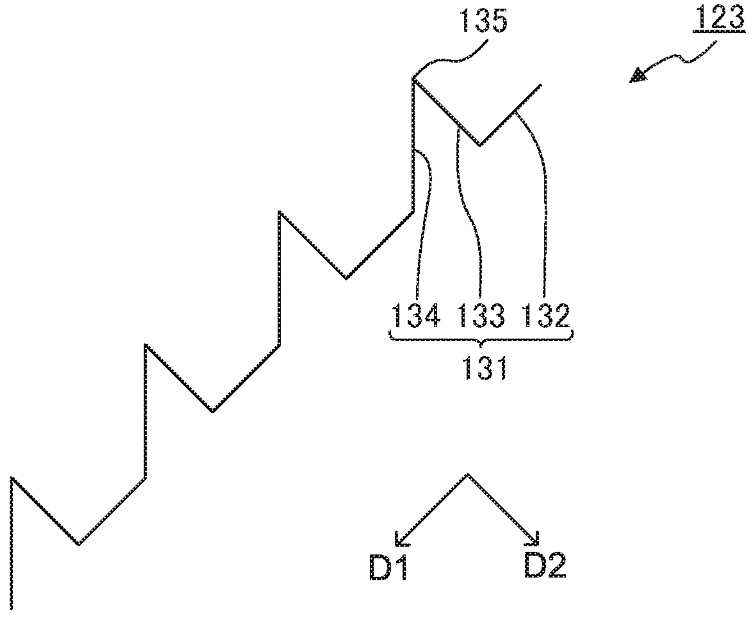

As illustrated in FIGS. 5A and 5B, light separating section 123 has a plurality of separating units 131. The number of separating units 131 is not particularly limited. Each separating unit 131 includes one first divided reflecting surface 132, one second divided reflecting surface 133 and one divided transmitting surface 134, respectively. Specifically, light separating section 123 has a plurality of first divided reflecting surfaces 132, a plurality of second divided reflecting surfaces 133 and a plurality of divided transmitting surfaces 134. In the following description, the inclination direction of first divided reflecting surface 132 is referred to as "first direction D1". First divided reflecting surface 132, second divided reflecting surface 133 and divided transmitting surface 134 are each divided in first direction D1. Further, first divided reflecting surface 132, second divided reflecting surface 133 and divided transmitting surface 134 are arranged in first direction D1.

First divided reflecting surface 132 is an inclining surface with respect to the optical axis of light L1 incident on first optical surface 121. First divided reflecting surface 132 is also an inclining surface with respect to the optical axis of light L2 incident on second optical surface 122. In the present embodiment, first divided reflecting surface 132 inclines so as to progressively move away from second optical surface 122 (optical transmission member 140) as first divided reflecting surface 132 approaches the bottom surface of optical receptacle 120 from the upper surface thereof. First divided reflecting surface 132 causes a part of light incident on first optical surface 121 to be internally reflected toward the side of second optical surface 122 as signal light Ls. Further, first divided reflecting surface 132 causes a part of light incident on second optical surface 122 to be internally reflected toward the side of first optical surface 121 as reception light Lr. The inclination angle of first divided reflecting surface 132 is 45° with respect to the optical axis of light L1 incident on first optical surface 121 and with respect to the optical axis of light L2 incident on second optical surface 122. First divided reflecting surfaces 132 are divided in first direction D1, and disposed at predetermined intervals. First divided reflecting surfaces 132 are disposed on the same plane in first direction D1.

Second divided reflecting surface 133 is an inclining surface with respect to the optical axis of light L1 incident on first optical surface 121. Second divided reflecting surface 133 inclines in second direction D2 that is different to first direction D1 that is the inclination direction of first divided reflecting surface 132. Specifically, second divided reflecting surface 133 inclines so as to progressively approach second optical surface 122 (optical transmission member 140) as second divided reflecting surface 133 approaches the bottom surface of optical receptacle 120 from the upper surface thereof. Second divided reflecting surface 133 reflects a part of light incident on second optical surface 122 toward the side of divided transmitting surface 134 as monitoring light Lm. The inclination angle of second divided reflecting surface 133 is 45° with respect to the optical axis of light L1 incident on first optical surface 121. Second divided reflecting surfaces 133 are divided in first direction D1, and disposed at predetermined intervals.

Divided transmitting surface 134 is a parallel surface with respect to the optical axis of light L1 incident on first optical surface 121. Divided transmitting surface 134 emits (transmits) monitoring light Lm incident on first optical surface 121 and reflected by second divided reflecting surface 133. Divided transmitting surfaces 134 are also divided in first direction D1, and disposed at predetermined intervals.

As illustrated in FIG. 5B, within a single separating unit 131, first divided reflecting surface 132, second divided reflecting surface 133 and divided transmitting surface 134 are arranged in the order mentioned in first direction (direction from the upper surface toward the bottom surface) DE Ridge line 135 is formed between second divided reflecting surface 133 and divided transmitting surface 134. In the present embodiment, a plurality of ridge lines 135 that are adjacent in first direction D1 are disposed in parallel with each other. A smallest angle among angles formed by second divided reflecting surfaces 133 and divided transmitting surfaces 134 is 45°. Angles formed by first divided reflecting surfaces 132 and second divided reflecting surfaces 133 are 90°. Further, a smallest angle among angles formed by divided transmitting surfaces 134 and first divided reflecting surfaces 132 (of neighboring separating unit 131) is 135°. In light separating section 123, a plurality of separating units 131 are arranged in first direction D1.

Figure 6A:
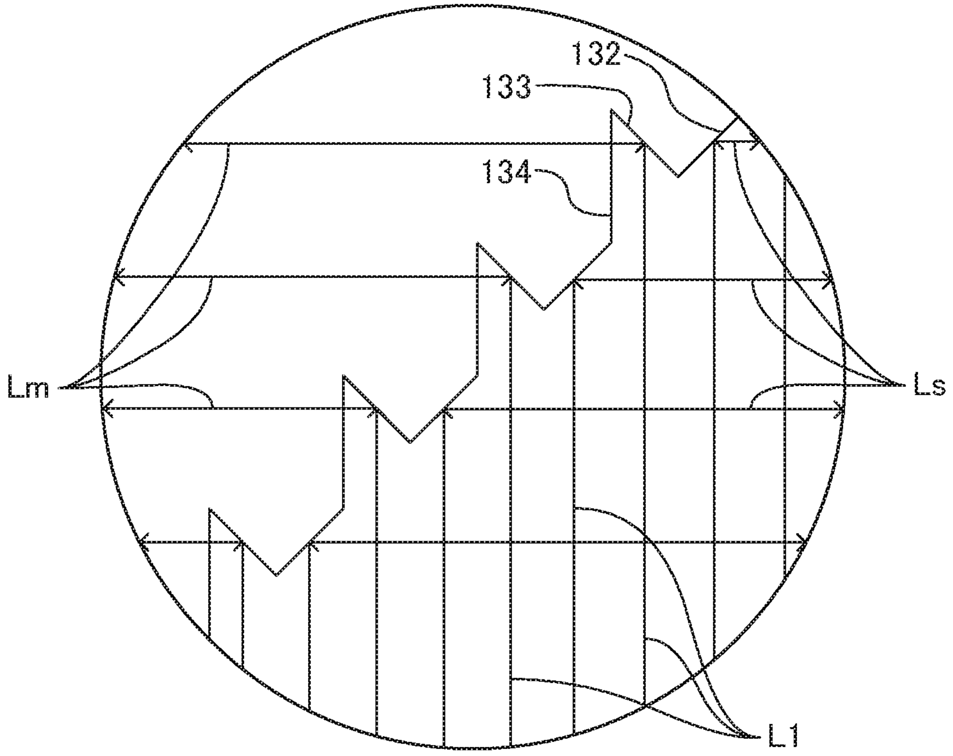
FIGS. 6A and 6B illustrate the configuration of the light separating section according to Embodiment 1.

As illustrated in FIG. 6A, a part of light L1 incident on first optical surface 121 is internally incident on first divided reflecting surface 132 at an incidence angle greater than a critical angle. First divided reflecting surface 132 internally reflects a part of light L1 incident on first optical surface 121 toward the side of second optical surface 122 to generate signal light Ls. Further, although not illustrated in particular in the drawings, a part of light incident on second optical surface 122 is also internally incident on first divided reflecting surface 132 at an incidence angle greater than the critical angle. First divided reflecting surface 132 internally reflects light L2 that is a part of light incident on second optical surface 122 toward the side of first optical surface 121 to generate reception light Lr.

Further, light that is a part of light L1 incident on first optical surface 121 is internally incident on second divided reflecting surface 133 at an incidence angle greater than the critical angle. Second divided reflecting surface 133 internally reflects the light that is a part of light L1 incident on first optical surface 121 toward the side of third optical surface 126 to generate monitoring light Lm.

Further, divided transmitting surface 134 transmits monitoring light Lm incident on first optical surface 121 and reflected by second divided reflecting surface 133.

Figure 6B:
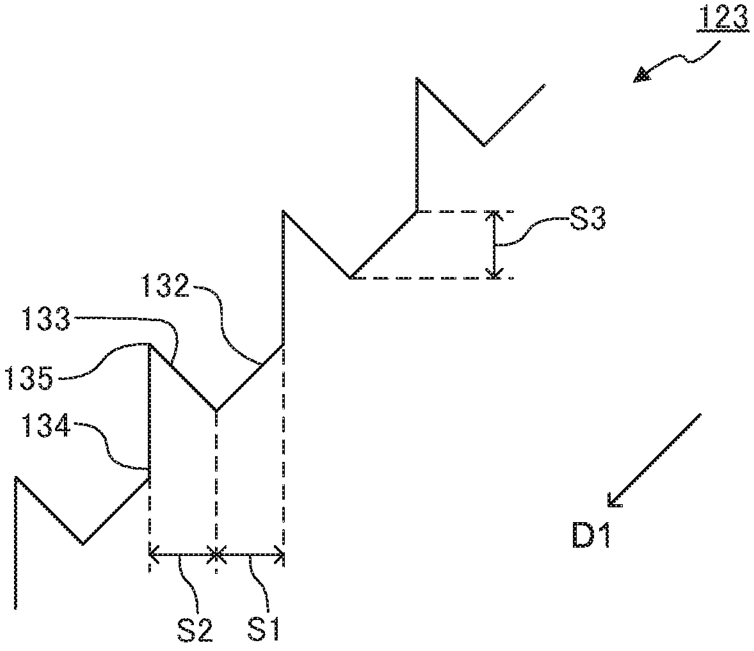

The light amount ratio between signal light Ls and monitoring light Lm is not particularly limited as long as monitoring light Lm can be obtained that can monitor the intensity and amount of light of light L1 emitted from light emitting element 112 while obtaining a desired amount of signal light Ls. As illustrated in FIG. 6B, the light amount ratio between signal light Ls and monitoring light Lm is substantially the same as an area ratio between area S1 of first divided reflecting surface 132 and area S2 of second divided reflecting surface 133 when viewed from first optical surface 121. The light amount ratio between signal light Ls and monitoring light Lm is preferably a ratio of signal light Ls:monitoring light Lm of 5:5 to 8:2, and more preferably is a ratio of signal light Ls:monitoring light Lm of 7:3. In the present embodiment, the ratio of signal light Ls:monitoring light Lm is 5:5. The light amount ratio between signal light Ls and monitoring light Lm can be adjusted by changing the area ratio between area S1 of first divided reflecting surface 132 and area S2 of second divided reflecting surface 133 when viewed from first optical surface 121. Further, the amount of reception light Lr directed toward light receiving surface 116 of light receiving element 113 is not particularly limited as long as a desired amount of light can be obtained. As illustrated in FIG. 6B, the amount of reception light Lr directed toward light receiving surface 116 of light receiving element 113 depends on the proportion of area S3 of first divided reflecting surface 132 when viewed from second optical surface 122. In the present embodiment, the light amount ratio between reception light Lr reflected at first divided reflecting surface 132 and light emitted from divided transmitting surface 134 is 5:5.

Second optical surface 122 is an optical surface that emits toward end surface 141 of optical transmission member 140 signal light Ls incident on first optical surface 121 and reflected by first divided reflecting surface 132. Further, second optical surface 122 is also an optical surface that causes light L2 emitted from end surface 141 of optical transmission member 140 to enter optical receptacle 120 while refracting light L2. In the present embodiment, second optical surface 122 has a shape of a convex lens surface which is convex toward end surface 141 of optical transmission member 140. Second optical surface 122 causes light that has moved forth through the inside of optical receptacle 120 to converge toward end surface 141 of optical transmission member 140, and also converts light emitted from end surface 141 of optical transmission member 140 into collimated light. In the present embodiment, the plurality of (four) second optical surfaces 122 are arranged in one row along the arrangement direction of optical transmission member 140 so as to face end surfaces 141 of optical transmission members 140, respectively, at the front of optical receptacle 120. The shape in a planar view of second optical surface 122 is circular. Preferably, the central axis of second optical surface 122 is perpendicular to end surface 141 of optical transmission member 140. Further, the central axis of second optical surface 122 preferably matches the optical axis of light emitted from optical transmission member 140. Note that in a case where optical transmission members 140 are arranged in two or more rows, second optical surfaces 122 are also arranged in the same number of rows.

Figure 4C:
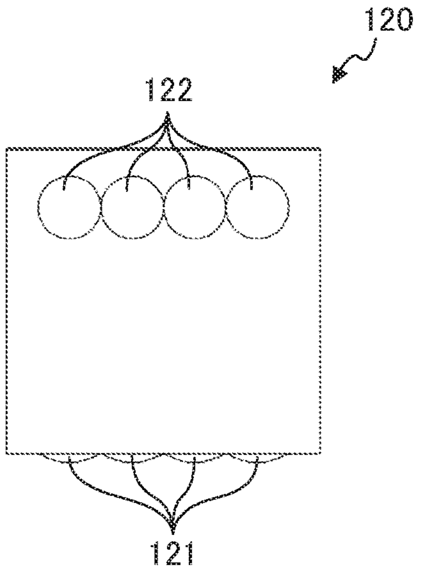
Figure 4D:
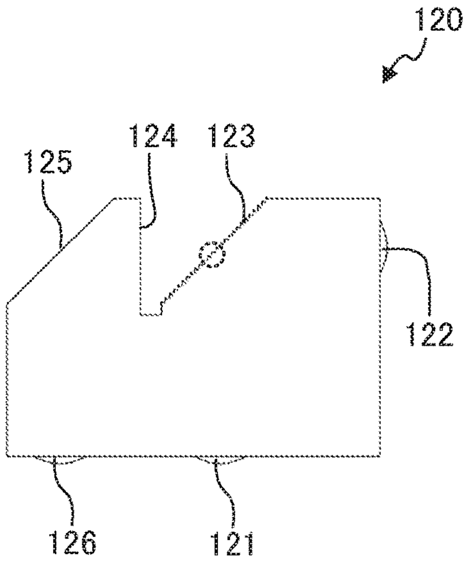

In the present embodiment, as illustrated in FIG. 4C, among the four second optical surfaces 122, two second optical surfaces 122 on the left side in the diagrammatic representation are used as second optical surfaces 122 on a transmission side, and two second optical surfaces 122 on the right side are used as second optical surfaces 122 on a reception side. Specifically, reception light Lr that moved forth through inside of optical receptacle 120 is emitted from the two second optical surfaces 122 on the transmission side that are on the left side in the diagrammatic representation, and light L2 emitted from optical transmission members 140 is incident on the two second optical surfaces 122 on the reception side that are on the right side in the diagrammatic representation.

Transmitting surface 124 is disposed on the upper surface side of optical receptacle 120, and allows monitoring light Lm emitted to outside of optical receptacle 120 from divided transmitting surfaces 134 of light separating section 123 to re-enter optical receptacle 120. In the present embodiment, transmitting surface 124 is a face that is perpendicular to the optical axis of monitoring light Lm emitted from divided transmitting surfaces 134 (is a parallel surface to the optical axis of light L1 emitted from light emitting element 112). By this means, monitoring light Lm travelling toward the side of second optical surfaces 122 can be allowed to re-enter optical receptacle 120 without being refracted. Note that transmitting surface 124 may be an inclining surface with respect to the optical axis of monitoring light Lm emitted from divided transmitting surfaces 134. In such a case, transmitting surface 124 inclines so as to progressively approach reflecting surface 125 as transmitting surface 124 approaches the upper surface of optical receptacle 120 from the bottom surface thereof. The inclination angle of transmitting surface 124 as an inclining surface is not particularly limited, and preferably the inclination angle is an angle which corresponds to a release taper for mold release during injection molding.

Reflecting surface 125 is disposed on the upper surface side of optical receptacle 120, and reflects monitoring light Lm incident on transmitting surface 124 to the side of third optical surfaces 126. In the present embodiment, reflecting surface 125 inclines so as to move away from second optical surfaces 122 (optical transmission members 140) as reflecting surface 125 approaches the bottom surface of optical receptacle 120 from the upper surface thereof. The inclination angle of reflecting surface 125 is 45° with respect to the optical axis of light L1 incident on first optical surfaces 121 and the optical axis of light L2 incident on second optical surfaces 122.

Third optical surface 126 is disposed on the bottom surface side of optical receptacle 120. Third optical surface 126 converges monitoring light Lm separated at light separating section 123, transmitted through transmitting surface 124 and reflected at reflecting surface 125, and emits the converged monitoring light Lm toward detecting elements 114. In the present embodiment, third optical surface 126 is a convex lens surface which is convex toward detecting elements 114. Preferably, the central axis of third optical surface 126 inclines relative to detection surface 117 (substrate 111) of detecting element 114.

A method for manufacturing optical receptacle 120 is not particularly limited. For example, optical receptacle 120 is manufactured by injection molding. In the injection molding, a metal mold piece having faces that are complementary to light separating section 123 and transmitting surface 124 is used. In this case, it is assumed that it will be difficult for resin or the like serving as the raw material to enter regions to be formed by a face corresponding to second divided reflecting surface 133 and a face corresponding to divided transmitting surface 134 in a cavity (portion at which optical receptacle 120 will be formed) inside the metal mold. Consequently, there is a concern that ridge lines 135 (regions formed between second divided reflecting surfaces 133 and divided transmitting surfaces 134) of separating units 131 in optical receptacle 120 as the molded article may not be appropriately formed. However, in optical receptacle 120 of the present embodiment, since light that reaches the apex of separating units 131 is light that serves as monitoring light Lm and for which high accuracy is not necessary, a significant problem will not arise even if the apexes of separating units 131 are not appropriately formed. On the other hand, the plurality of first divided reflecting surfaces 132 are disposed so as to be located on the same plane, and can be appropriately formed in a reliable manner. Therefore, the plurality of first divided reflecting surfaces 132 that generate light that serves as signal light Ls which significantly influences communication accuracy can be formed with a high degree of accuracy.

FIGS. 7A and 7B illustrate optical paths in the optical module. FIG. 7A is a view of optical paths on the transmission side, and FIG. 7B is a view of optical paths on the reception side. In FIGS. 7A and 7B, only the optical axes are illustrated using alternate long and short dash lines.

As illustrated in FIG. 7A, light L1 emitted from light emitting elements 112 enters optical receptacle 120 at first optical surfaces 121. One part of the light that enters optical receptacle 120 is internally reflected toward second optical surfaces 122 at first divided reflecting surfaces 132 to become signal light Ls. Signal light Ls reflected at first divided reflecting surfaces 132 is emitted from second optical surfaces 122 and arrives at end surfaces 141 of optical transmission members 140. Thus, light L1 emitted from light emitting elements 112 passes through only first optical surfaces 121 and second optical surfaces 122 and arrives at optical transmission members 140. Further, the entire optical path between first optical surface 121 and second optical surface 122 is located inside optical receptacle 120. On the other hand, the other part of the light that enters optical receptacle 120 is reflected toward reflecting surface 125 at second divided reflecting surfaces 133 to become monitoring light Lm. After being emitted to outside of optical receptacle 120 at divided transmitting surfaces 134, monitoring light Lm re-enters optical receptacle 120 at transmitting surface 124 and is reflected at reflecting surface 125. Monitoring light Lm reflected at reflecting surface 125 is emitted from third optical surfaces 126 and arrives at detecting elements 114.

Further, as illustrated in FIG. 7B, light L2 emitted from optical transmission members 140 enters optical receptacle 120 at second optical surfaces 122. One part of the light that enters optical receptacle 120 is internally reflected toward first optical surfaces 121 by first divided reflecting surfaces 132 to become reception light Lr. Reception light Lr reflected by first divided reflecting surfaces 132 is emitted from first optical surfaces 121 and arrives at light receiving surfaces 116 of light receiving elements 113. Thus, light emitted from optical transmission members 140 passes through only second optical surfaces 122 and first optical surfaces 121 and arrives at light receiving elements 113. Further, the entire optical path between second optical surface 122 and first optical surface 121 is located inside optical receptacle 120. Note that, the other part of the light that entered optical receptacle 120 at second optical surfaces 122 is emitted to outside of optical receptacle 120 by divided transmitting surfaces 134, and thereafter re-enters optical receptacle 120 at transmitting surface 124 and is reflected at reflecting surface 125.

(Simulation)

Figure 1:
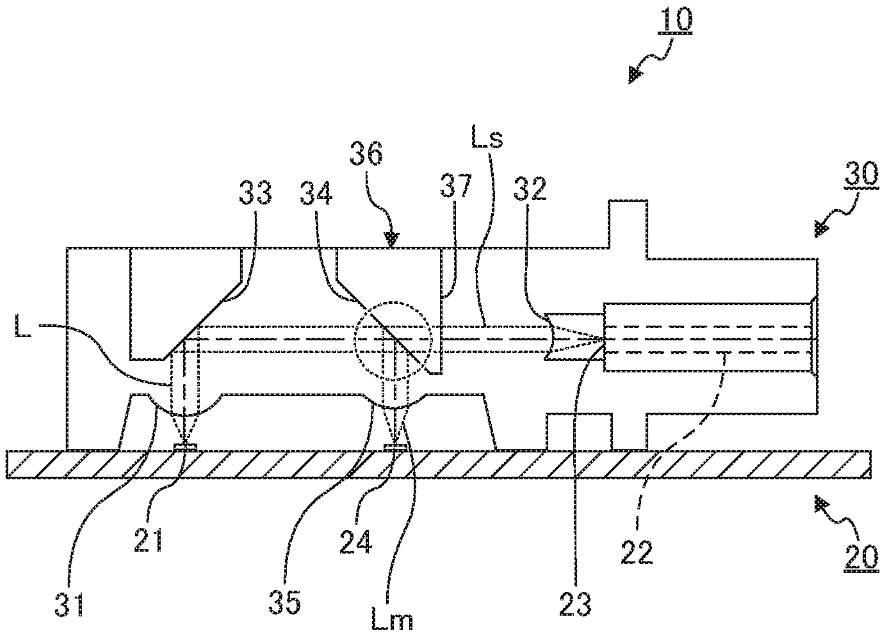
FIG. 1 is a cross-sectional view of an optical module disclosed in PTL 1.

The use efficiency of light in optical receptacle 120 according to the present embodiment was simulated. The material used for optical receptacle 120 was polyetherimide (PEI), and the pitch between separating units 131 was made 0.0275 mm Specifically, the use efficiency of light that arrived at optical transmission members 140 and detecting elements 114 in a case where one watt of light was emitted from light emitting elements 112 was determined. In the present simulation, the area of first divided reflecting surface 132 and the area of second divided reflecting surface 133 when viewed from the side of light emitting elements 112 were the same. Further, as a comparison, the use efficiency of light in optical receptacle 30 (see FIG. 1) disclosed in PTL 1 was also determined.

In optical receptacle 120 according to the present embodiment, when 1 W of light was emitted from light emitting elements 112, signal light Ls that arrived at optical transmission members 140 (end surfaces 141) was 0.425976 W (−3.70624 dB). On the other hand, monitoring light Lm that arrived at detecting elements 114 (detection surfaces 117) was 0.439266 W (−3.57273 dB). Note that the following equation 1 was used for conversion between W and dB.

$$dB=10\times\log(W) \quad (1)$$

In optical receptacle 30 disclosed in PTL 1, on the optical path from light emitting element 21 to optical transmission member 22, light passes through an additional two interfaces (light separating section 34 and incidence surface 37) in comparison to optical receptacle 120 according to the present embodiment. In this case, the amount of light that is lost each time the light passes through one interface is approximately 5.8% (−0.26 dB). Hence, in optical receptacle 30 disclosed in PTL 1, −0.52 dB (−0.26 dB×2) of light is lost in comparison to optical receptacle 120 according to the present embodiment. In other words, it was found that the use efficiency of light in optical receptacle 120 according to the present embodiment is 10.16% (0.52 dB) higher than in optical receptacle 30 described in PTL 1.

(Effects)

As described above, in optical receptacle 120 according to Embodiment 1, because light L1 emitted from light emitting element 112 (light receiving element 113) passes through only first optical surface 121 and second optical surface 122 to reach optical transmission member 140, reflected light reflected at an interface and stray light can be reduced. Therefore, in optical receptacle 120 according to the present embodiment, the use efficiency of light can be improved in comparison to the conventional optical receptacle (optical receptacle 30 disclosed in PTL 1). Further, in optical module 100 according to Embodiment 1, since an optical path length between first optical surface 121 and second optical surface 122 can be easily shortened, optical module 100 can be easily reduced in size.

In addition, because the plurality of first divided reflecting surfaces 132 that generate light that serves as signal light Ls which significantly influences communication accuracy can be easily formed with a high degree of precision, optical receptacle 120 according to the present embodiment can be manufactured at a low cost.

Embodiment 2

In an optical module according to Embodiment 2, only the configuration of the optical receptacle differs from optical module 100 according to Embodiment 1. Therefore, components that are the same as in Embodiment 1 are denoted by the same reference numerals and a description of these components is omitted hereunder.

The optical module according to Embodiment 2 has photoelectric conversion device 110 and optical receptacle 220. The optical module is used in a state in which optical transmission member 140 is connected through a ferrule to optical receptacle 220. In the present embodiment, four optical fibers are arranged in one row at regular intervals.

Figure 8:
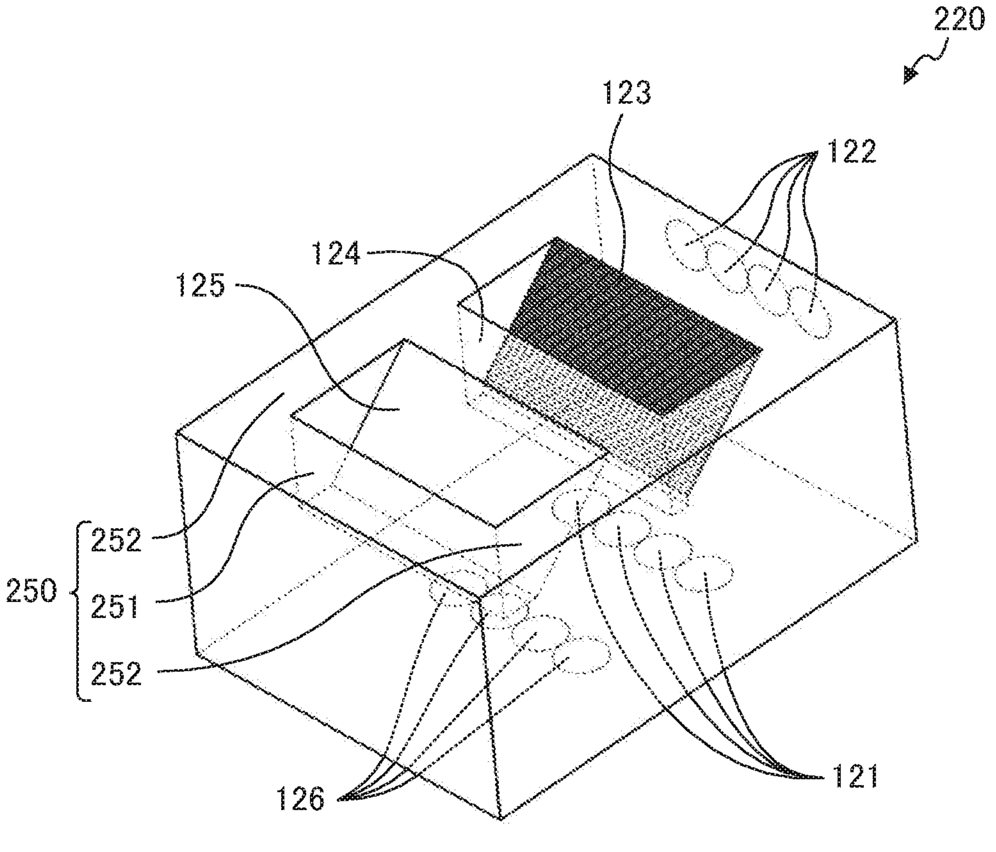
FIG. 8 is a perspective view of an optical receptacle according to Embodiment 2.

FIG. 8 is a perspective view of optical receptacle 220 according to Embodiment 2. As illustrated in FIG. 8, optical receptacle 220 according to Embodiment 2 has a plurality of first optical surfaces 121, a plurality of second optical surfaces 122, light separating section 123, transmitting surface 124, reflecting surface 125, a plurality of third optical surfaces 126 and frame body 250.

Frame body 250 is disposed around light separating section 123 and reflecting surface 125. Frame body 250 has rear wall 251 located on the rear-face side of optical receptacle 220, and side-face walls 252 located at the side-face sides of optical receptacle 220. The upper surface of frame body 250 is disposed so as to be coplanar with the upper surface between light separating section 123 and reflecting surface 125. By this means, light separating section 123 and reflecting surface 125 can be appropriately protected.

Figure 9:
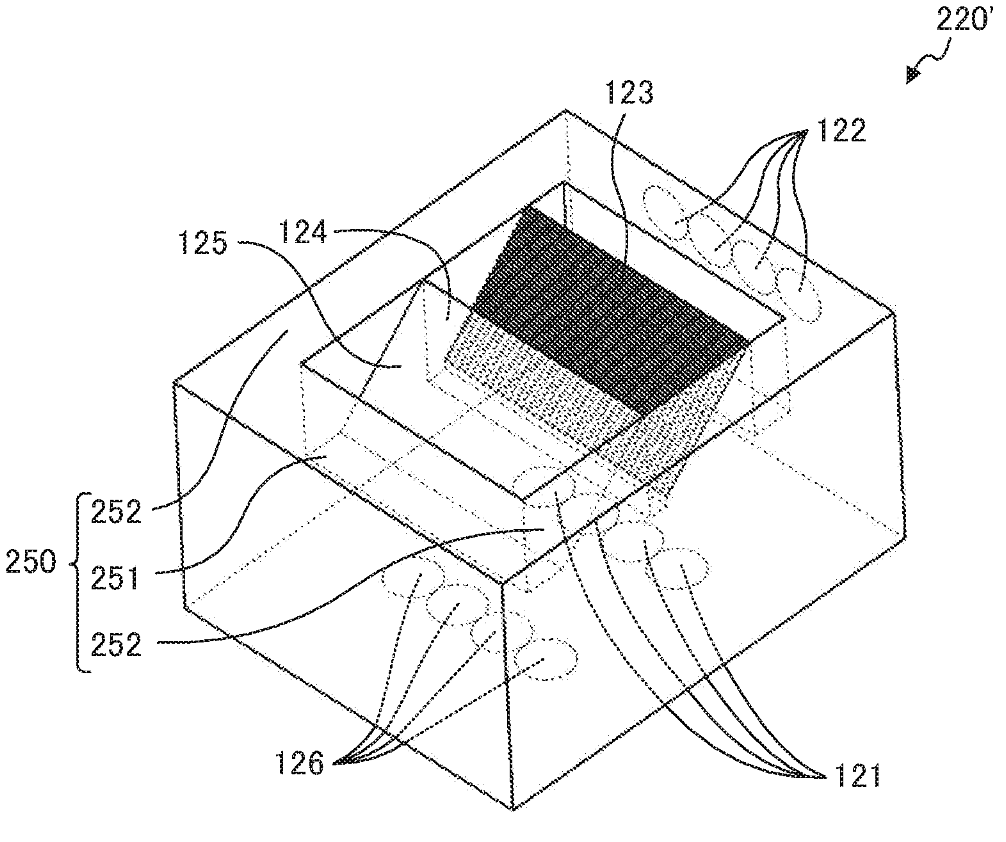
FIG. 9 is a perspective view of an optical receptacle according to a modification of Embodiment 2.

FIG. 9 is a perspective view of optical receptacle 220' according to a modification of Embodiment 2. As illustrated in FIG. 9, optical receptacle 220' need not have an upper surface between transmitting surface 124 and reflecting surface 125.

(Effects)

As described above, in optical receptacles 220 and 220' according to Embodiment 2, in addition to the effects of optical receptacle 120 according to Embodiment 1, light separating section 123, transmitting surface 124 and reflecting surface 125 can be appropriately protected from foreign matter and the like. Further, the occurrence of stray light can also be suppressed.

Embodiment 3

In an optical module according to Embodiment 3, only the configuration of the optical receptacle differs from the optical module according to Embodiment 2. Therefore, components that are the same as in Embodiment 2 are denoted by the same reference numerals and a description of these components is omitted hereunder.

The optical module according to Embodiment 3 has photoelectric conversion device 110 and optical receptacle 320.

Figure 10A:
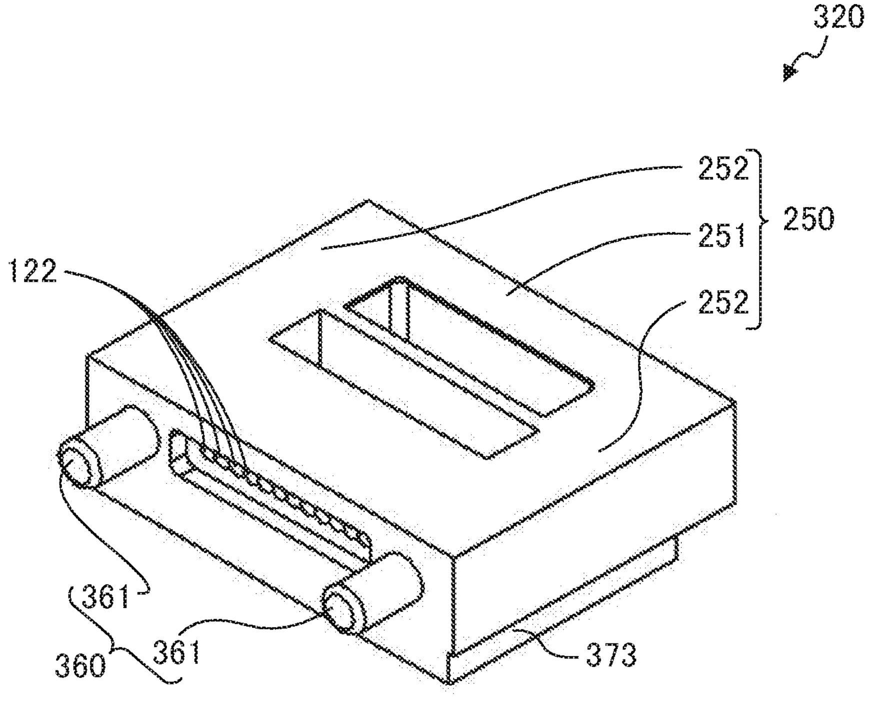
FIGS. 10A and 10B are perspective views of an optical receptacle according to Embodiment 3.
Figure 10B:
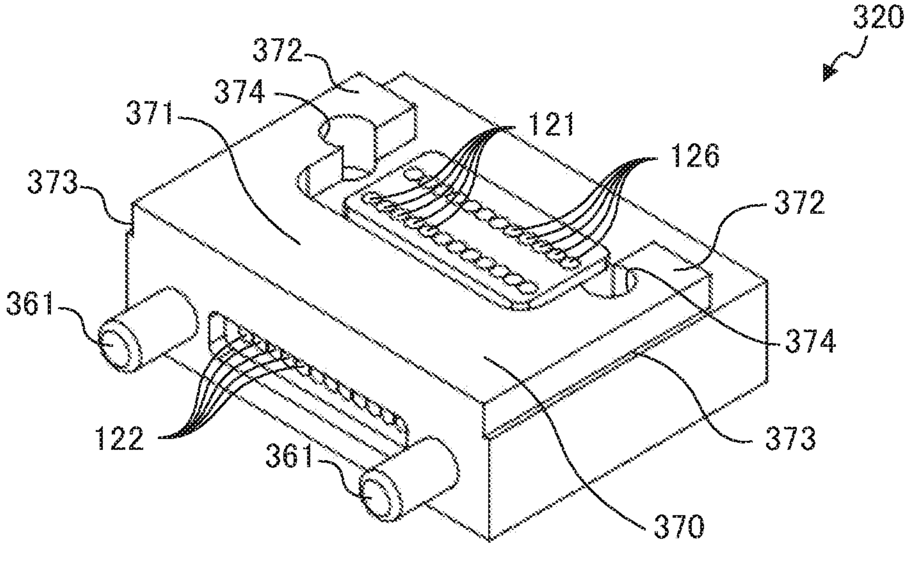
Figure 11A:
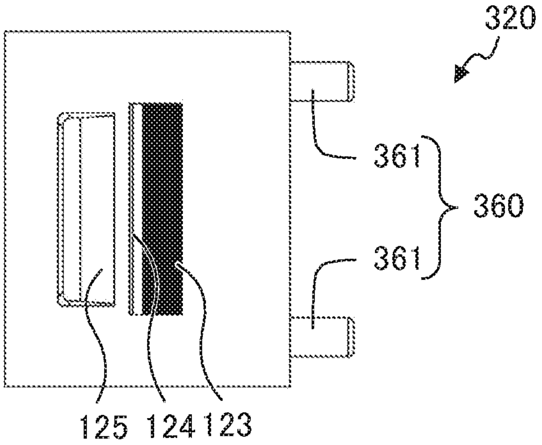
FIGS. 11A to 11E illustrate the configuration of the optical receptacle according to Embodiment 3.
Figure 11B:
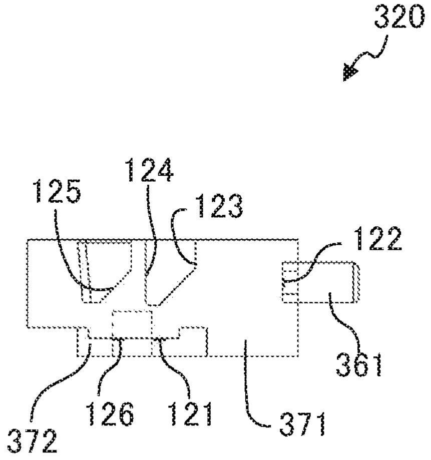
Figure 11C:
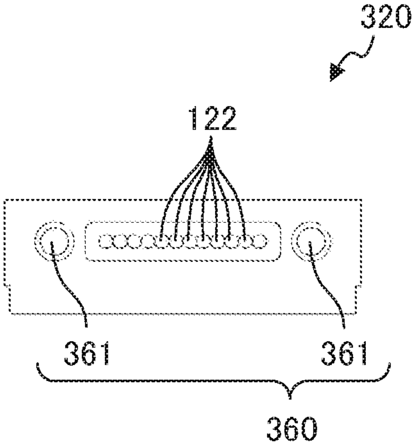
Figure 11D:
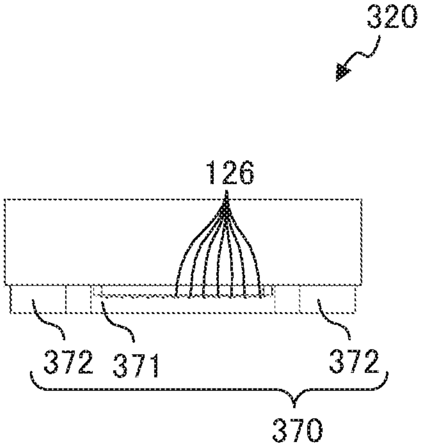
Figure 11E:
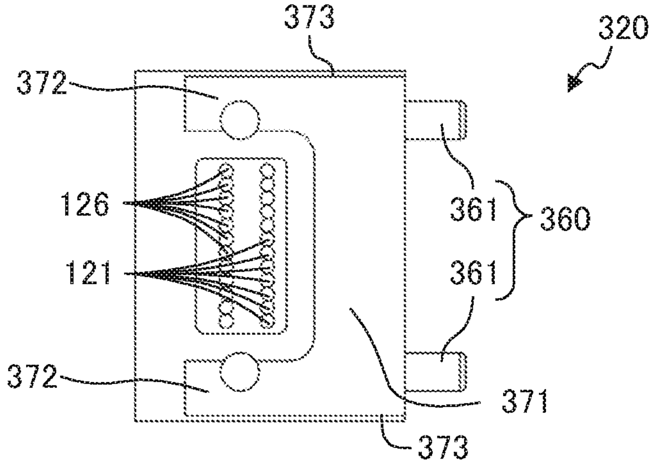

FIGS. 10A and 10B and FIGS. 11A to 11E illustrate the configuration of optical receptacle 320 according to Embodiment 3. FIG. 10A is a perspective view of optical receptacle 320 according to Embodiment 3 as viewed from above, and FIG. 10B is a perspective view of optical receptacle 320 as viewed from the underside thereof. FIG. 11A is a plan view of optical receptacle 320 according to Embodiment 3, FIG. 11B is a cross-sectional view of optical receptacle 320, FIG. 11C is a front view of optical receptacle 320, FIG. 11D is a rear view of optical receptacle 320, and FIG. 11E is a bottom surface of optical receptacle 320. Note that hatching is omitted from the cross-section of optical receptacle 320 in FIG. 11B.

As illustrated in FIGS. 10A and 10B and FIGS. 11A to 11E, optical receptacle 320 according to Embodiment 3 has a plurality of first optical surfaces 121, a plurality of second optical surfaces 122, light separating section 123, transmitting surface 124, reflecting surface 125, a plurality of third optical surfaces 126, frame body 250, ferrule attachment section 360 and substrate attachment section 370. Note that in the present embodiment the number of first optical surfaces 121, second optical surfaces 122 and third optical surfaces 126 is 12, respectively.

In the present embodiment, as illustrated in FIG. 11E, among the 12 first optical surfaces 121, six first optical surfaces 121 on the upper side in the diagrammatic representation are used as first optical surfaces 121 on a transmission side, and six first optical surfaces 121 on the lower side are used as first optical surfaces 121 on a reception side. Thus, in optical receptacle 320 according to the present embodiment, the 12 first optical surfaces 121 are equally divided into two regions by taking a plane perpendicular to substrate 111 as the center of the 12 first optical surfaces 121, with one of the regions functioning as the transmission side and the other region functioning as the reception side.

Ferrule attachment section 360 is a part for attaching and detaching a ferrule that fixes optical transmission member 140. Ferrule attachment section 360 is disposed on the front face of optical receptacle 320. The configuration of ferrule attachment section 360 is not particularly limited as long as a ferrule can be attached and detached. In the present embodiment, ferrule attachment section 360 has a pair of projections 361 disposed with all of second optical surfaces 122 in the long-side direction in-between. The shape and number of projections 361 is not particularly limited as long as a ferrule can be fixed to optical receptacle 320. In other words, the shape of projection 361 may be any shape that is a complementary shape to a recess of the ferrule.

Substrate attachment section 370 fixes optical receptacle 320 at a predetermined position with respect to substrate 111. Specifically, by fixing optical receptacle 320 at a predetermined position with respect to substrate 111, substrate attachment section 370 positions first optical surfaces 121 with respect to light emitting surfaces 115 of light emitting elements 112 and light receiving surfaces 116 of light receiving elements 113, and positions third optical surfaces 126 with respect to detection surfaces 117 of detecting elements 114. The configuration of substrate attachment section 370 is not particularly limited as long as substrate attachment section 370 can exert the aforementioned functions. In the present embodiment, substrate attachment section 370 is a convex part disposed on the bottom surface of optical receptacle 320. Substrate attachment section 370 is disposed in a region excluding the regions of first optical surface 121, third optical surface 126 and a rear-face side of optical receptacle 320 on the bottom surface of optical receptacle 320. Substrate attachment section 370 has front section 371 that is located on the front side of optical receptacle 320, and side sections 372 that are located on the side-face sides of optical receptacle 320. Adhesive accommodating grooves 373 and fitting recesses 374 are formed in side sections 372. Adhesive accommodating grooves 373 are notched grooves formed in the side-face sides (outer sides of side sections 372) of optical receptacle 320. Fitting recesses 374 are formed on the side of first optical surfaces 121 and third optical surfaces 126. Fitting recesses 374 are formed in complementary shape with respect to the shape of an unshown fitting convex part of substrate 111.

(Effects)

As described above, optical receptacle 320 according to Embodiment 3 has similar effects to the effects of optical receptacle 220 according to Embodiment 2. Further, because optical receptacle 320 according to Embodiment 3 has fitting recesses 374 formed in a complementary shape to a fitting convex part of substrate 111, optical receptacle 320 can be easily positioned with respect to substrate 111.

Figure 12A:
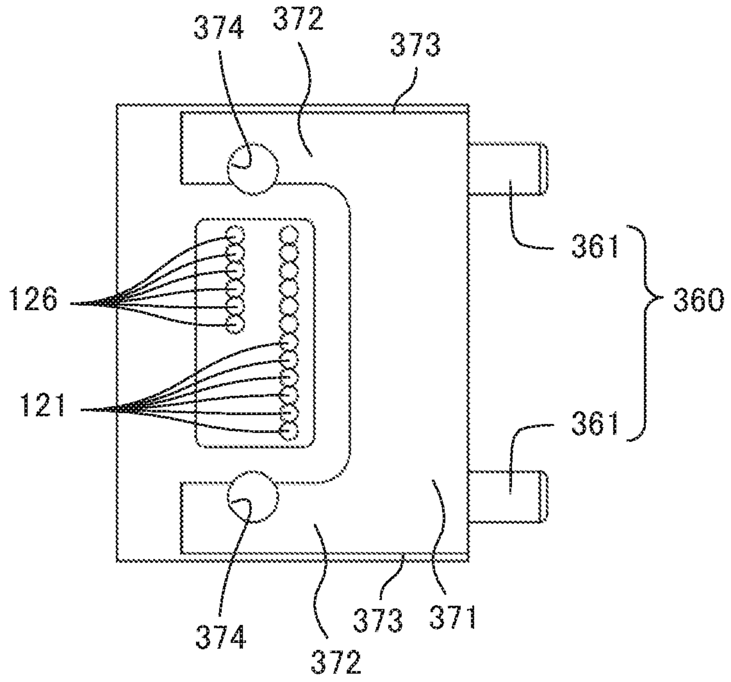
FIGS. 12A and 12B illustrate other arrangements of first optical surfaces.
Figure 12B:
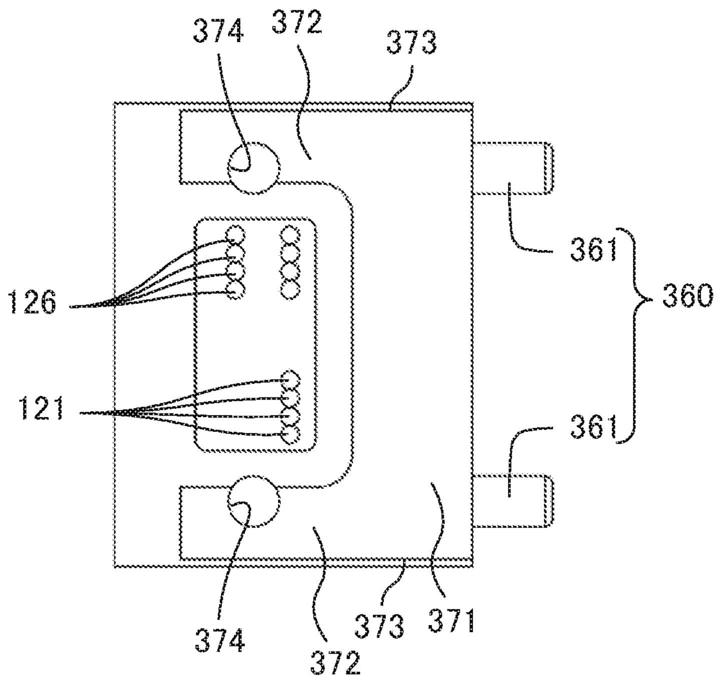

Note that, as illustrated in FIG. 12A, third optical surfaces 126 may be disposed in a number that corresponds to the number of light emitting elements 112 that emit signal light Ls. Further, as illustrated in FIG. 12B, the transmission side region and the reception side region may be separated from each other.

Figure 13:
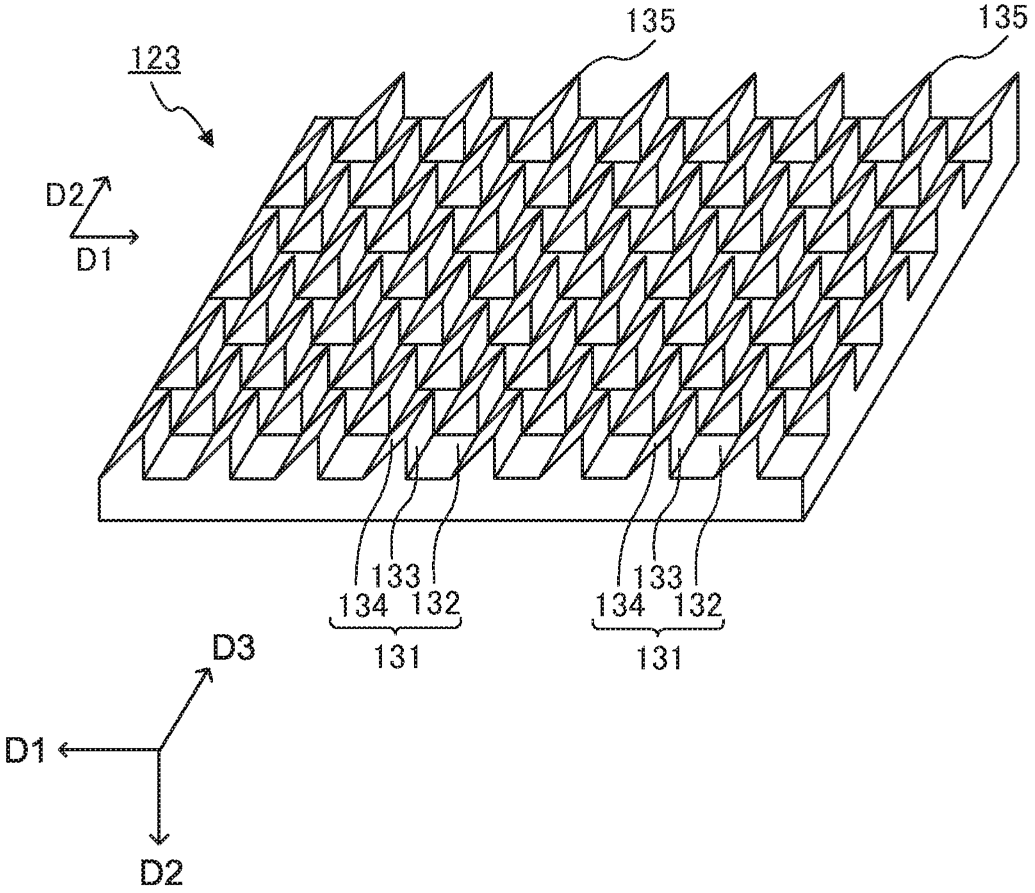
FIG. 13 is a perspective view illustrating another form of the light separating section.

Further, as illustrated in FIG. 13, separating units 131 of light separating section 123 may be alternately disposed in third direction D3 that is orthogonal to first direction D1 and second direction D2 so as be arranged in a matrix.

A reflective film such as a thin film of a metal having high light reflectance (for example, Al, Ag or Au) may be formed on reflecting surface 125, first divided reflecting surfaces 132, and second divided reflecting surfaces 133. In a case where reduction of the number of components is to be prioritized, preferably a configuration that utilizes only a total reflection surface is adopted. Further, light separating section 123 of the present embodiment may also have other divided reflecting surfaces in addition to first divided reflecting surfaces 132 and second divided reflecting surfaces 133.

Although optical receptacle 120 for transmitting and receiving has been described in Embodiments 1 to 3, an optical receptacle of the present invention may also be an optical receptacle for transmitting or may be an optical receptacle for receiving. In the case of an optical receptacle for transmitting, a plurality of light emitting elements 112 and a plurality of detecting elements 114 are disposed in the optical receptacle. Further, light L1 emitted from the plurality of light emitting elements 112 is made incident on the plurality of first optical surfaces 121, respectively. Furthermore, the plurality of second optical surfaces 122 cause signal light Ls reflected by first divided reflecting surfaces 132 to be emitted toward end surfaces 141 of the plurality of optical transmission members 140, respectively. In addition, the plurality of third optical surfaces 126 emit monitoring light Lm reflected by reflecting surface 125, toward detection surfaces 117 of detecting elements 114, respectively. In the case of an optical receptacle for receiving, a plurality of light receiving element 113 are disposed in the optical receptacle. Light L2 emitted from the plurality of optical transmission members 140 is made incident on the plurality of second optical surfaces 122. Further, the plurality of first optical surfaces 121 emit reception light Lr reflected by first divided reflecting surfaces 132, toward light receiving surfaces 116 of light receiving elements 113, respectively. Note that, in Embodiments 1 and 2 the number of light emitting elements 112, light receiving elements 113, detecting elements 114, first optical surfaces 121, second optical surfaces 122, third optical surfaces 126 and optical transmission members 140 is four, respectively. Further, in Embodiment 3, the number of light emitting elements 112, light receiving elements 113, detecting elements 114, first optical surfaces 121, second optical surfaces 122, third optical surfaces 126 and optical transmission members 140 is 12, respectively.

The present application claims priority based on Japanese Patent Application No. 2015-014299 filed on Jan. 28, 2015. The entire contents of the specification and drawings of Japanese Patent Application No. 2015-014299 are hereby incorporated by reference into the specification of the present application.

INDUSTRIAL APPLICABILITY

The optical receptacle and optical module according to the present invention are useful, for example, for optical communications which use an optical transmission member.

REFERENCE SIGNS LIST

10 Optical module
20 Photoelectric conversion device
21 Light emitting element
22 Optical transmission member
23 End surface
24 Detecting element
30 Optical receptacle
31 First optical surface
32 Second optical surface
33 Reflecting surface
34 Light separating section
35 Third optical surface
36 Recess
37 Incidence surface
100 Optical module
110 Photoelectric conversion device
111 Substrate
112 Light emitting element
113 Light receiving element
114 Detecting element
115 Light emitting surface
116 Light receiving surface
117 Detection surface
120, 220, 220', 320 Optical receptacle
121 First optical surface
122 Second optical surface
123 Light separating section
124 Transmitting surface
125 Reflecting surface
126 Third optical surface
131 Separating unit
132 First divided reflecting surface
133 Second divided reflecting surface
134 Divided transmitting surface
135 Ridge line
140 Optical transmission member
141 End surface
250 Frame body
251 Rear wall
252 Side-face wall
360 Ferrule attachment section
361 Projection
370 Substrate attachment section
371 Front section
372 Side section
373 Adhesive accommodating groove
374 Fitting recess

What is claimed is:

1. An optical receptacle to be disposed between one or more optical transmission members and a photoelectric conversion device, the photoelectric conversion device including one or more photoelectric conversion elements and one or more detecting elements disposed at a position further away from the optical transmission member relative to the photoelectric conversion element for monitoring light emitted from the photoelectric conversion elements, the optical receptacle being used for optically coupling the photoelectric conversion element and an end surface of the optical transmission member, the optical receptacle comprising:

one or more first optical surfaces that allow light emitted from the photoelectric conversion element to be incident thereon, or that cause light emitted from the end surface of the optical transmission member and passes through inside of the optical receptacle to be emitted toward the photoelectric conversion element;

one or more second optical surfaces that cause light incident on the first optical surface to be emitted toward the end surface of the optical transmission member, or allow light emitted from the end surface of the optical transmission member to be incident thereon;

a light separating section disposed on an optical path between the first optical surface and the second optical surface, the light separating section separating light incident on the first optical surface into signal light directed toward an end surface side of the optical transmission member and monitoring light directed toward the detecting element side so as to move forth in an approximately opposite direction to a traveling direction of the signal light, or the light separating section causing at least one part of light incident on the second optical surface to move forth to the photoelectric conversion element side as reception light; and one or more third optical surfaces that cause the monitoring light separated at the light separating section to be emitted toward the detecting element, wherein the light separating section includes a plurality of separating units that each include: a first divided reflecting surface that is an inclining surface inclined in a first direction with respect to an optical axis of light incident on the first optical surface, a second divided reflecting surface that is an inclining surface inclined in a second direction that is different to the first direction, and a divided transmitting surface that is a parallel surface with respect to the optical axis, and in which the first divided reflecting surface, the second divided reflecting surface and the divided transmitting surface are arranged in the first direction, wherein the plurality of separating units are arranged in the first direction in the light separating section, wherein the first divided reflecting surface internally reflects a part of light incident on the first optical surface toward the second optical surface side as the signal light, or internally reflects a part of light incident on the second optical surface toward the first optical surface side as the reception light, wherein the second divided reflecting surface internally reflects a part of light incident on the first optical surface toward the divided transmitting surface as the monitoring light, wherein the divided transmitting surface transmits the monitoring light reflected at the second divided reflecting surface, and wherein an entire optical path between the first optical surface and the second optical surface is located inside the optical receptacle.

2. The optical receptacle according to claim 1, further comprising a reflecting surface that reflects the monitoring light separated at the light separating section toward the third optical surface.

3. An optical module, comprising:

a photoelectric conversion device including a substrate, one or more photoelectric conversion elements disposed on the substrate, and one or more detecting elements disposed on the substrate for monitoring light emitted from the photoelectric conversion element; and an optical receptacle according to claim 1, wherein the detecting element is disposed at a position that is further away from the optical transmission member relative to the photoelectric conversion element on the substrate.

4. An optical module, comprising:

a photoelectric conversion device including a substrate, one or more photoelectric conversion elements disposed on the substrate, and one or more detecting elements disposed on the substrate for monitoring light emitted from the photoelectric conversion element; and an optical receptacle according to claim 2, wherein the detecting element is disposed at a position that is further away from the optical transmission member relative to the photoelectric conversion element on the substrate.

* * * * *